Jan. 29, 1957 K. LEHOVEC 2,779,877

MULTIPLE JUNCTION TRANSISTOR UNIT

Filed June 17, 1955

INVENTOR.
KURT LEHOVEC
BY
Roland Dexter
HIS ATTORNEY

United States Patent Office 2,779,877

Patented Jan. 29, 1957

2,779,877

MULTIPLE JUNCTION TRANSISTOR UNIT

Kurt Lehovec, Williamstown, Mass., assignor to Sprague Electric Company, North Adams, Mass., a corporation of Massachusetts Application June 17, 1955, Serial No. 516,180

4 Claims. (Cl. 250—211)

This invention relates to semiconductor signal translating devices and more particularly to bi-stable circuits which include a novel semiconductive device.

Bi-stable circuits that include transistors of the junction type form the subject matter of United States Patent No. 2,655,609, issued October 13, 1953. This patent is concerned with the use of a pair of symmetrical multiple junction transistors associated so as to constitute a composite circuit element having novel advantageous characteristics as a switching structure readily transferable from the open circuit to the closed state upon application of a voltage of prescribed amplitude between the input terminals. The individual transistors used have to be protected carefully against the influence of the operational enviroment by hermetic sealing. This requirement of hermetic sealing necessitates a housing requiring a substantially greater volume than that volume demanded by the physical configuration of the transistor itself. Further, to be satisfactory, the operational characteristics of the two transistors must be carefully matched for incorporation into the circuit.

One general object of this invention is therefore to produce multiple junction semiconductor crystals suitable for bi-stable circuits. A more specific object of this invention is production of a fused junction by a novel process. Other objects will be apparent from the following paragraphs and appended drawings.

Briefly, the objects of this invention have been achieved by the production of a semiconductive crystal of the symmetrical multiple grown junction type which further has at least two fused junction regions integrated into one conductivity region of the multiple junction.

In a more limited sense, the objects of this invention have been achieved by the production of a signal translating device which comprises a semiconductive crystal of the symmetrical multiple grown junction type having at least two fused junctions with electrodes secured respectively to the intermediate section of said multiple grown junction, the two said fused junctions and the end regions of said multiple grown junction.

The invention and the other features noted above will be understood more clearly and fully from the detailed description with reference to the accompanying drawings in which.

Figure 8:
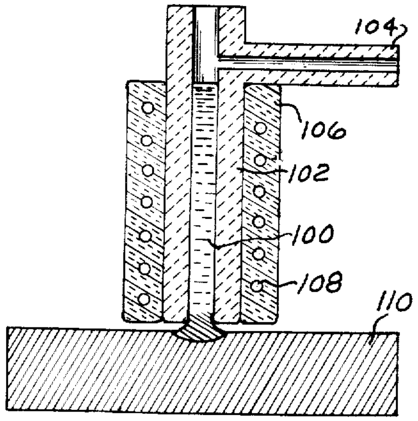
Figure 7:
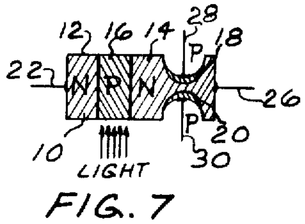

Fig. 7 pictures a cross-sectional view of a light responsive signal translating device; and Fig. 8 is a cross-sectional view of an apparatus for imposing the fused junction regions onto the surface of the multiple grown junction crystal.

Figure 1:
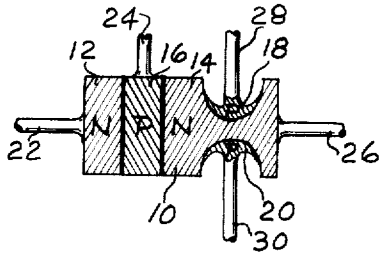
Fig. 1 is a cross-sectional view of the grown and fused junction semiconductor element of the invention.

Referring now to the drawings, Fig. 1 shows a cross-section of a semiconductive structure which replaces two of the transistors previously required for bi-stable circuits. The crystal 10 is monocrystalline and of germanium or silicon appropriately doped with impurities so as to effect symmertical multiple junctions of the n-p-n or p-n-p types. Herein is shown a grown n-p-n crystal having the n-regions designated 12 and 14 and the p intermediate region as 16. At one end of the crystal there are imposed two regions 18 and 20 of p conductivity produced as fused junctions. It is thus seen that there is in one crystal an n-p-n body which in turn finds one of the regions of n conductivity serving as the intermediate conductivity region for a p-n-p junction crystal. Appropriate non-rectifying electrodes 22, 24, 26, 28 and 30 are attached to the crystal shown in Fig. 1. For best operation the crystal 10 has surface depressions in which the fused junctions are produced so as to limit the thickness of the intermediate n region. For certain applications it is not necessary to have the non-rectifying electrode 26 present.

Figure 2:
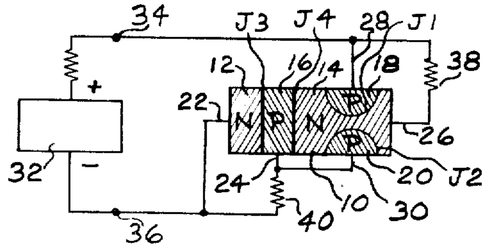
Fig. 2 is a diagram representing a circuit embodiment of utilizing the device of the invention.

In Fig. 2 which shows an elementary circuit application of the device of the invention the source 32, poled as shown in the drawing, is connected between the terminals 34 and 36 of the composite crystalline body. The terminals 34 and 36 may be, for example, the cross points in telephone switching systems. The polarity of the source 32 is such that at least one reversed biased junction is included in every current path that can be traced between the terminals 34 and 36 through the composite multiple junction crystal 10. Thus, as shown, the junctions J–2 and J–4 are biased in the reverse or high resistance direction, at least one of which junctions is included in any current path through the combination. The operating state with such a polarity is thus the high impedance or low current condition. Upon increase of the voltage between the terminals 34 and 36 the currents passed by the reversely biased junctions J–2 and J–4 will increase changing the bias across J–1 and J–3 which is a function of the current flow through resistors 38 and 40. At a certain potential the circuit will change to a high current or conduction condition which state obtains when the resistances of the crystal approach those of resistors 38 and 40. Thus the circuit may be triggered from a substantially open circuit (low current) state to a closed circuit (high current) state by the application of voltage of a necessary magnitude between the terminals 34 and 36.

Figure 3:
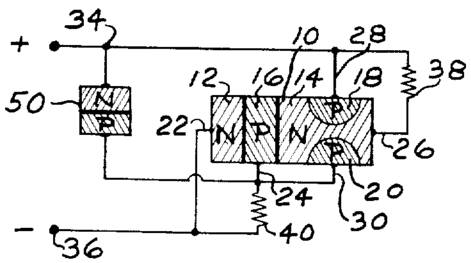
Figs. 3, 4 and 5 depict other circuitry including both Zener diodes and the device of the invention.
Figure 4:
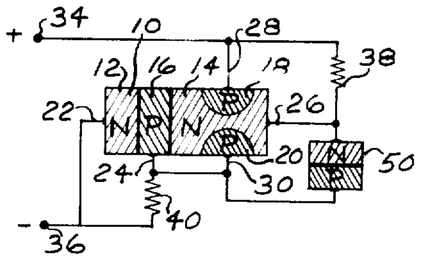

In certain applications it is desirable to determine the point at which the circuit will trigger at a present value. This is readily accomplished by modification of the circuit of Fig. 2 to that of Figs. 3, 4 and 5 by the utilization of a semiconductor junction diode 50, for example, germanium or silicon, which is connected in series with resistor 40 between the terminals 34 and 36. Therefore in Fig. 3, when the voltage between the terminals 34 and 36 rises to such a level as to establish the Zener voltage across the diode, the resulting large current which flows through both resistors 38 and 40 produces such biases on the respective emitters of the composite transistor element to transfer the condition from a low current to a high current level. The preparation of such Zener diodes is readily accomplished by surface melting of a crystal of given impurity, doping the melt with an impurity which produces a body of opposite conductivity and solidifying. The Zener voltage is a function of the conductivity of the crystal and can thus be fabricated for a given voltage of up to 100 volts or greater. In both Figs. 2 and 3, after the device is triggered to the high current or closed circuit conditions, it remains in that condition until the voltage between the terminals 34 and 36 is reduced to substantially 0. For ease of discussion the designation of the elements is common for Figs. 2, 3, 4 and 5. In Fig. 4 the Zener diode is in series with the resistors 38 and 40 so that when the voltage between 34 and 36 reaches the Zener voltage the circuit shifts to the conduction state.

Figure 5:
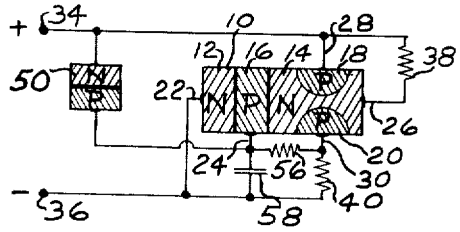

Now looking a Fig. 5, it may be particularly advantageous in the utilization of a switching system to effect changes of the conduction state with small exciting currents of very short duration. Herein the Zener diode 50 is in series with resistor 40 and a second resistor 56 which resistor combination 56 and 40 is paralleled by a capacitor 58. The resistor 40 is made relatively small in comparison to the resistors 38 and 56, with the resistor 38 being quite large. As the Zener voltage is obtained across the diode 50 from the terminals 34 and 36, substantial current flow occurs through resistor 40 changing the system to a conducting state. When the voltage between terminals 34 and 36 falls to a low value before the transition to the high current condition has been completed, this change will continue as the resistor 40 discharges capacitor 58 slowly because of the relatively high value of resistor 56. The voltage drop in the high current condition will be small since a low resistance path is provided through resistor 40.

Figure 6:
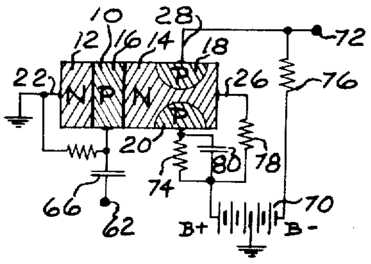
Fig. 6 illustrates an amplifier circuit using the single transistor of the invention.

As it is apparent, the device of the invention can be used wherever it is desired to have a direct connection from the emitter or collector region of a transistor element to the base region of a second transistor element. In Fig. 6 the structure is used as an integral part of a direct coupled pulse amplifier. The input voltage 62 is imposed through a coupling capacitor 66 to the base region 16 of p-type conductivity. The emitter 12 is grounded while the n-region 14 serves both as the collector for the n-p-n segment and the base for the n-p-n portion of the composite crystal 10. A center grounded battery 70 produces both the positive voltage for the emitter region 20 and the negative bias for the collector region 18. Upon application of a positive pulse to 62 the n-p-n segment conducts to amplify the pulse which in turn is amplified by the p-n-p segment producing an output at 72. Resistors 74, 76 and 78 and capacitor 80 determine the output level of the amplified pulse.

In Fig. 7 is shown a light sensitive device produced according to this invention. The electrode connected in the foregoing drawings to the base region of the grown multiple junction crystal has been replaced by a light beam. Such embodiment would thus act as a photo transistor of considerable sensitivity.

The rectifying electrode contacts which are actually of the fused type and previously indicated as 18 and 20 can be applied in the manner shown in Fig. 8. A quantity of molten electrode material 100 is held in a capillary tube 102 of carbon, glass or quartz, for example. An internal tube diameter of about 5 mils or less is particularly suitable. The molten electrode material, which can be an indium-germanium alloy in equal parts by weight, is readily drawn up in such a capillary as by applying suction through a conveniently connected side tube 104 near the upper end of the capillary. The top of the capillary can be covered by a plug, not shown, or can be sealed shut if desired. In order to keep the electrode material from solidifying in the capillary, it can be surrounded by a jacket of insulation 106 and in addition an electric heating coil 108, either of the resistive or inductive type, can be provided to generate heat.

The capillary containing the molten electrode material is used by placing its lower end against or within about 10 mils of the surface of the body 110 to which the electrode is to be applied. Pressure then applied as by way of the side tube 104 will cause the lower end of the molten column of conductive material to be forced out and into contact with the surface of the body 110. By keeping the conductive material at a relatively low temperature, as for example 100 to 500° C. below the freezing point of the molten electrode material, the contacting end will solidify and be firmly affixed to the surface of the body 110 with limited diffusion of the impurity so that the rectifying junction is immediately below the crystal surface. Although wider differences in temperature can be used, the best adhesion, which closely approximates a welded joint, will be formed when a small temperature difference is present. After the end of the molten stem has solidified, the capillary can be slowly withdrawn from the solidified joint with or without the continued application of pressure to the side tube 104, and the molten electrode material will be pulled out, gradually solidifying against the adhered end to provide an elongated filament.

By using the above technique, an electrode contact having a contact area two mils wide or even less, is readily provided on bodies of germanium, silicon or even on the surface of other materials such as indium wafers or the like. The contacted surface of body 110 can have a melting point above or below that of the electrode material 100.

To produce the device of the invention, a germanium crystal is pulled from a germanium melt which is doped repeatedly during the pulling in order to create an n-p-n symmetrical multiple junction structure. The p-region should be of a width of about ½ mil. A wafer of about 100 mils by 20 mils surface area is cut from the grown crystal and reduced to a thickness of about 2 mils by known lapping and etching techniques. Two indium electrodes are fused on opposite sides of one n-region and into the crystal to a depth each of about 0.5 mil or a 1 mil separation. This is accomplished by disposing indium pellets of from 15 to 30 mils diameter on the opposing surfaces and heating in a hydrogen atmosphere to about 500° C. for five minutes. Thereafter etch the crystal in a mixture of hydrofluoric and nitric acids, wash with water and dry. The electrode to the n-region not containing the fused junction is soldered with a solder containing antimony for a non-rectifying contact. The electrode to the intermediate p-region of the grown junction can be a fused gold wire containing 2% of indium for a non-rectifying contact. The fused regions have electrodes of platinum wire attached to the indium deposits. A modification of these latter contacts are the rectifying electrodes by the process of Fig. 8. Further, the crystal need not be lapped to a thickness of 2 mils but can be upwards of 10 mils with indentations in the surface where the fused p-regions are created, said indentations each about 4 mils deep.

The junctions 18 and 20 shown as a fused type need only be of a rectifying nature so that they include numerous configurations such as surface barrier rectifying metal contacts, rectifying pressure contacts of the point contact wire type, mercury type and fused wire type; electrically formed rectifying pressure contacts; grown junctions produced by local surface melting and recrystallizing after introduction of impurities; and rectifying contacts produced by diffusion of impurities into the semiconductor, forming a p-n junction and application of non-rectifying electrodes to the diffused region.

As many apparently widely different embodiments of this invention may be made without departing from the spirit and scope hereof, it is to be understood that the invention is not limited to the specific embodiments hereof except as defined in the appended claims.

What is claimed is:

1. A semiconductor crystal of a grown symmetrical multiple junction structure having two fused junctions disposed inwardly from opposed surfaces of said crystal, said fused junctions present in an end region of conductivity of said multiple junction structure.

2. A signal translating device comprising a semiconductor crystal of a grown symmetrical multiple junction structure having at least two fused junctions present in an end conductivity region of said structure, electrodes secured respectively to the intermediate conductivity region of said structure, the end conductivity regions of said structure and to the surfaces of said crystal defined by said fused junctions and bi-stable circuit means integrated with said electrodes.

3. A light responsive signal translating device comprising a semiconductor crystal of a grown symmetrical multiple junction structure having disposed in opposed relationship in a terminal conductivity region of said structure two fused junctions, non-rectifying electrodes secured respectively to the terminal conductivity regions of said structure and to the surface regions of said crystal defined by the fused junctions, a means for photoillumination of the intermediate conductivity region of said structure.

4. A circuit controlling element comprising an n-p-n grown multiple junction semiconductor crystal having two fused junctions, resistor means connecting the first n-region of said grown junction to said p-region of said grown junction, a second resistor means connecting the other of said n-regions of said grown junction to one of said fused junctions, said fused junction further connected both to the n-region of a semiconductor diode and the signal source, the other of said fused junctions connected to the intermediate p-region of said grown junction and to the p-region of said diode, said first n-region of said grown junction connected to the signal source, said diode having a pre-assigned Zener voltage.

References Cited in the file of this patent

UNITED STATES PATENTS

| | | |
|---|---|---|
| 2,654,059 | Shockley | Sept. 29, 1953 |
| 2,657,360 | Wallace | Oct. 27, 1953 |

UNITED STATES PATENT OFFICE

CERTIFICATE OF CORRECTION

Patent No. 2,779,877 January 29, 1957

Kurt Lehovec

It is hereby certified that error appears in the printed specification of the above numbered patent requiring correction and that the said Letters Patent should read as corrected below.

Column 1, line 29, for "enviroment" read -- environment --; column 3, line 32, for "n-p-n", second occurrence, read -- p-n-p --.

Signed and sealed this 24th day of December 1957.

(SEAL)
Attest:

KARL H. AXLINE
Attesting Officer

ROBERT C. WATSON
Commissioner of Patents